US007570190B1

United States Patent
Pagones et al.

(10) Patent No.: US 7,570,190 B1
(45) Date of Patent: Aug. 4, 2009

(54) METHOD AND SYSTEM FOR OPERATING A COMPARATOR

(75) Inventors: Andrew J. Pagones, Palatine, IL (US); Poojan A. Wagh, Sleepy Hollow, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 12/057,696

(22) Filed: Mar. 28, 2008

(51) Int. Cl.
*H03M 1/12* (2006.01)
(52) U.S. Cl. ........................ 341/155; 341/166
(58) Field of Classification Search ................ 341/118, 341/120, 143, 166, 155
See application file for complete search history.

(56) References Cited

U.S. PATENT DOCUMENTS

| | | | | |
|---|---|---|---|---|
| 5,543,793 A | * | 8/1996 | Saiki | ........................ 341/155 |
| 5,883,590 A | * | 3/1999 | Sugden et al. | ............... 341/164 |
| 6,792,042 B1 | * | 9/2004 | Bae | .............................. 375/238 |
| 6,965,339 B2 | | 11/2005 | Midya et al. | |
| 7,313,005 B2 | * | 12/2007 | Azuma et al. | .................. 363/41 |
| 2008/0048898 A1 | | 2/2008 | Miller et al. | |

OTHER PUBLICATIONS

Lukas Dörrer et al—"A 3mW 74dB SNR 2MHz CT ΔE ADC with a Tracking-ADC-Quantizer in 0.13 μm CMOS"—pp. 492-493, 612—Chapter 27.1 of ISSCC—Session 27—"Filters and Continous-Time ΔE Converters"—2005 IEEE—Int'l Solid-State Circuits Conference.

* cited by examiner

*Primary Examiner*—Brian Young

(57) ABSTRACT

A method and system for operating a comparator (602) is provided. The method includes analyzing an output (612) of the comparator (602) based on one or more of a transition of the output, present operational state of the comparator, and at least one time instant corresponding to the output. The method further includes controlling an operational state of the comparator (602) based on the analysis of the output (612).

27 Claims, 9 Drawing Sheets

METHOD AND SYSTEM FOR OPERATING A COMPARATOR

FIELD OF INVENTION

The present invention relates generally to electronic circuits. More specifically, the present invention relates to comparators used in electronic circuits.

BACKGROUND OF THE INVENTION

Comparators are widely used in electronic circuits to compare analog signals. Depending on a mathematical relation between instantaneous values of the analog signals, an output of a comparator attains one of a plurality of predefined voltage levels. For example, if an instantaneous voltage of an input signal is greater than an instantaneous voltage of a reference signal, the output of the comparator may attain +L Volts, while the comparator may attain −L Volts if the instantaneous voltage of the input signal is lesser than the instantaneous voltage of the reference signal.

In some electronic circuits, in addition to the analog signals, the comparator may receive a periodic trigger signal. The trigger signal may enable the comparator only at one time instant within each period of the trigger signal. In other words, the comparator compares the analog signals only when a trigger signal is present. Such a scenario exists, for example, in a Pulse Width Modulated Analog to Digital Converter (PWM-ADC) as described in U.S. Pat. No. 6,965,339B2, assigned to Motorola, Inc., and herein incorporated by reference In a PWM-ADC, an input analog signal is compared with a reference triangular signal to produce a PWM signal. In order to further process the PWM signal with a digital circuit, the PWM signal, which is continuous in time, needs to be converted into a discrete time signal. In other words, the PWM signal needs to be sampled at regular time instants. One method of obtaining a discrete time PWM signal is to periodically trigger the comparator with a quantization clock. The quantization clock quantizes the transitions of the PWM signal along the time axis.

As a result of triggering the comparator using the quantization clock at regular time instants, the output of the comparator includes a series of sample values. Additionally, the frequency of the quantization clock is selected to be high enough to yield an over sampled PWM signal for better performance of the PWM-ADC. However, triggering a comparator at high frequencies results in considerable amount of power dissipation in the comparator.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
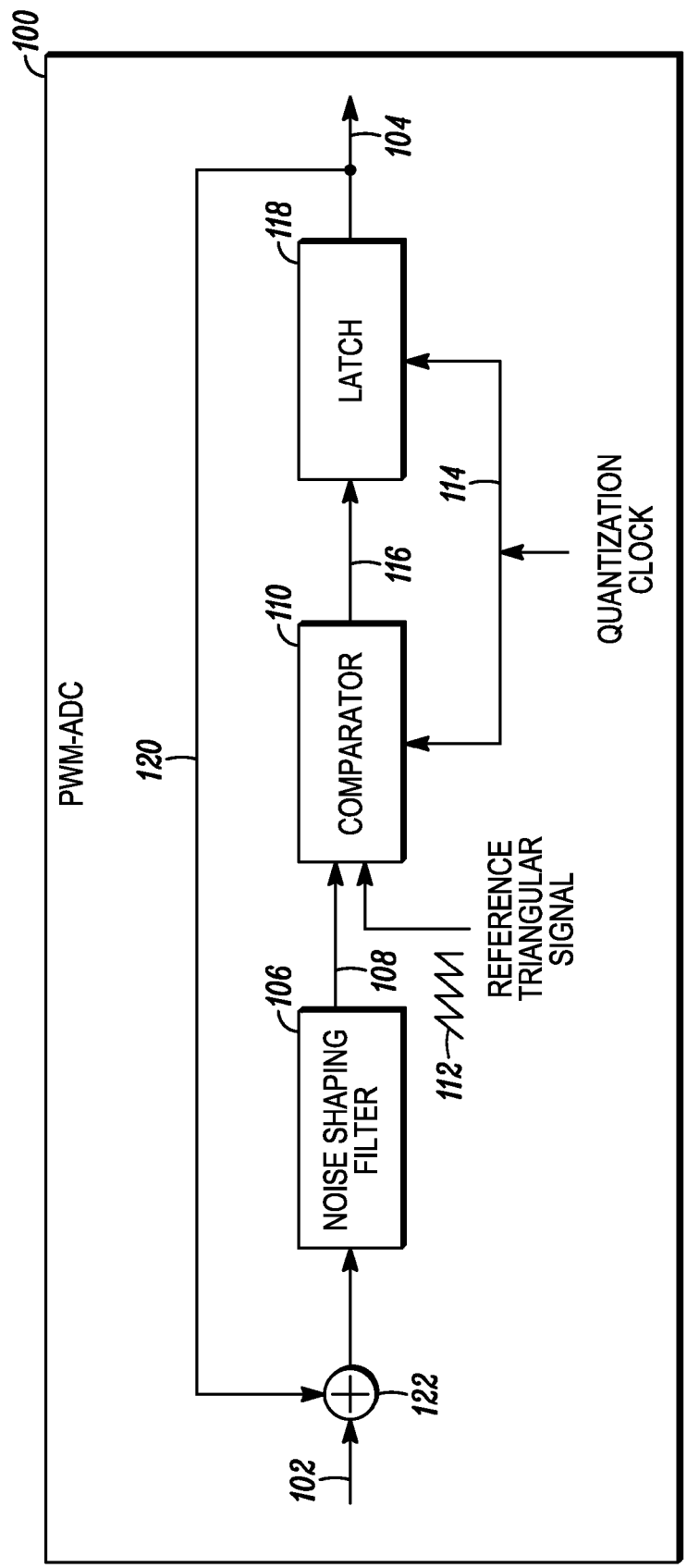
FIG. 1 is a block diagram illustrating an example of a Pulse Width Modulated Analog to Digital Converter (PWM-ADC) in which various embodiment of the invention may function.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of method steps and apparatus components related to a method and system for operating a comparator. Accordingly, the system components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Generally speaking, pursuant to various embodiments, the present invention provides methods and systems for operating a comparator. The method includes analyzing an output of the comparator based on one or more of a transition of the output, present operational state of the comparator, and at least one time instant corresponding to the output. The method further includes controlling an operation state of the comparator based on the analysis of the output. The operational state of the comparator may be one of a disabled state, an enabled state, and a low power state.

FIG. 1 is a block diagram illustrating an example of a Pulse Width Modulated Analog to Digital Converter (PWM-ADC) 100 in which various embodiment of the invention may function. The PWM-ADC 100 converts an input analog signal 102, which is continuous in time and amplitude, to a digital Pulse Width Modulated (PWM) signal 104, which is quantized in both time and amplitude. A duty cycle of the digital PWM signal 104 over a time interval is proportional to an amplitude of the input analog signal 102 over the time interval.

To convert the input analog signal 102 to the digital PWM signal 104, the input analog signal 102 is fed into a noise shaping filter 106. The noise shaping filter 106 yields a filtered signal 108 from the input analog signal 102. Thereafter, a comparator 110 receives the filtered signal 108 and a reference triangular signal 112. Thereafter, the comparator 110 samples the filtered signal 108 at a rate that corresponds to a frequency of the reference triangular signal 112. Additionally, the comparator 110 receives a quantization clock 114, which periodically triggers the comparator 110. Therefore, for quantization, the comparator 110 compares the filtered signal 108 with the reference triangular signal 112 at a time instant within each period of the quantization clock 114. As a result, an output 116 of the comparator 110 includes a series of sample values of a PWM signal. A duty cycle of the PWM signal over a time interval is proportional to the amplitude of the filtered signal 108 over the time interval. More specifically, the filtered signal 108 is sampled by the comparator 110 in order to convert amplitude information of the filtered signal 108 into duty cycle information of the PWM signal.

Further, a frequency of the quantization clock 114 is maintained several times higher than the frequency of the reference triangular signal 112. As a result, the PWM signal includes more samples than are required to reconstruct a corresponding continuous time PWM signal. Maintaining the frequency of the quantization clock 114 higher than the frequency of the reference triangular signal 112 results in better performance of the PWM-ADC 100.

Finally, the output 116 of the comparator 110 is fed to a latch 118 to yield the digital PWM signal 104. The latch 118 may be, for example, a D flip-flop. The latch 118 may be synchronized with the comparator 110 using the quantization clock 114. Therefore, output of the latch 118 includes samples which occur at a rate equal to the frequency of the quantization clock 114.

To further improve performance of the PWM-ADC 100, a feedback signal 120 derived from output of the latch 118 is fed back to input of the PWM-ADC 100. More specifically, output of the latch 118 is fed back to the noise shaping filter 106 through a summer 122. The summer 122 also receives the input analog signal 102. Therefore, input to the noise shaping filter 106 includes a sum of the input analog signal 102 and the feedback signal 120.

Figure 2:
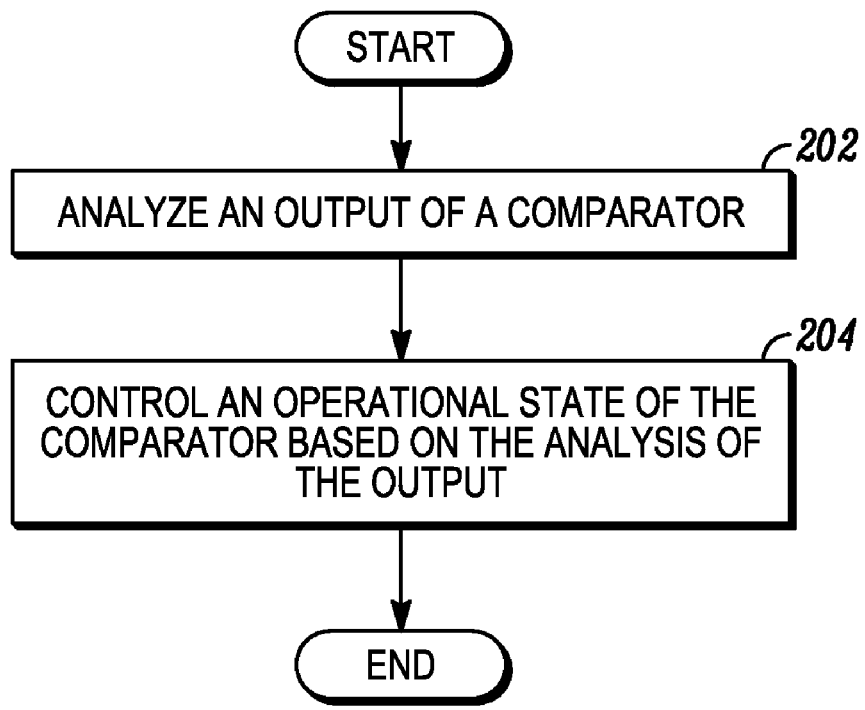
FIG. 2 is a flow diagram illustrating a method of operating a comparator, in accordance with an embodiment of the invention.

FIG. 2 is a flow diagram illustrating a method of operating a comparator, in accordance with an embodiment of the invention. The comparator receives a plurality of input signals and a periodic sampling wave. The periodic sampling wave enables the comparator at regular time instants. For example, in the PWM-ADC 100, the comparator 110 receives the filtered signal 108 and the reference triangular signal 112, as input signals, and generates a PWM signal at the output 116 of the comparator 110. Additionally, the comparator 110 receives the quantization clock 114 (periodic sampling wave) which enables the comparator 110 at regular time instants in order to quantize the transitions of the PWM signal along the time axis.

At step 202, an output of the comparator is analyzed. The output is analyzed based on one or more of: transitions of the output, present operational state of the comparator, and at least one time instant corresponding to the output. The output of the comparator includes a sequence of sample values occurring at the regular time instants. The sample values may be one of a plurality of voltages and a plurality of current levels. For example, the sample values may be one of +L Volts and −L Volts. The comparator may include more than one output. For example, the comparator may include two output terminals. In this case, a voltage level at a first output terminal indicates a first mathematical relationship between input signals, and a voltage level at a second output terminal indicates a second mathematical relationship between input signals. Each of the first mathematical relationship and the second mathematical relationship may be one of, but are not limited to, > (greater than), < (less than), ≦ (less than or equal to), ≧ (greater than or equal to), ≠ (not equal to) and = (equal to) mathematical relationships.

The output of the comparator may be analyzed to detect an occurrence of one or more transitions of the output. This is further explained in detail in conjunction with FIG. 3, described later. Based on the occurrence of one or more transitions detected in the output, an occurrence of a transition of the output may be predicted. The transition for which the occurrence is predicted may be one of a present and a future transition. This is further explained in detail in conjunction with FIG. 4, described later. Alternatively, a signal dependent on the output of the comparator may be analyzed. For example, in the PWM-ADC 100, the output of the latch 118, which is dependent on output of the comparator 110, may be analyzed.

Based on the analysis of the output of the comparator, an operational state of the comparator is controlled at step 204. The operational state of the comparator may be one of an enabled state, a disabled state, and a low power state. The operational state of the comparator may be controlled based on the analysis of the output of the comparator. For example, the operational state of the comparator may be changed from the enabled state to the disabled state.

In an embodiment, the analysis of the output may indicate that the output of the comparator may remain constant over a time interval. In this case the comparator may operate in one of the disabled state and the low power state during the time interval. Alternatively, the analysis of the output may indicate that the output of the comparator may undergo a transition over a time interval. In this case the comparator may operate in the enabled state during the time interval. As a result, a considerable amount of power may be saved by disabling the comparator over a time interval when output of comparator is unlikely to change. This is further explained in detail in conjunction with FIG. 5, described later.

In order to control the operational state of the comparator, the power supplied to the comparator may be controlled. Alternatively, the periodic sampling wave received by the comparator may be gated to control the operational state of the comparator. For example, in the PWM-ADC 100, the operational state of the comparator 110 may be controlled by gating the quantization clock 114. More specifically, the comparator 110 may be disabled over a time interval by preventing the quantization clock 114 from triggering the comparator 110 during the time interval.

Figure 3:
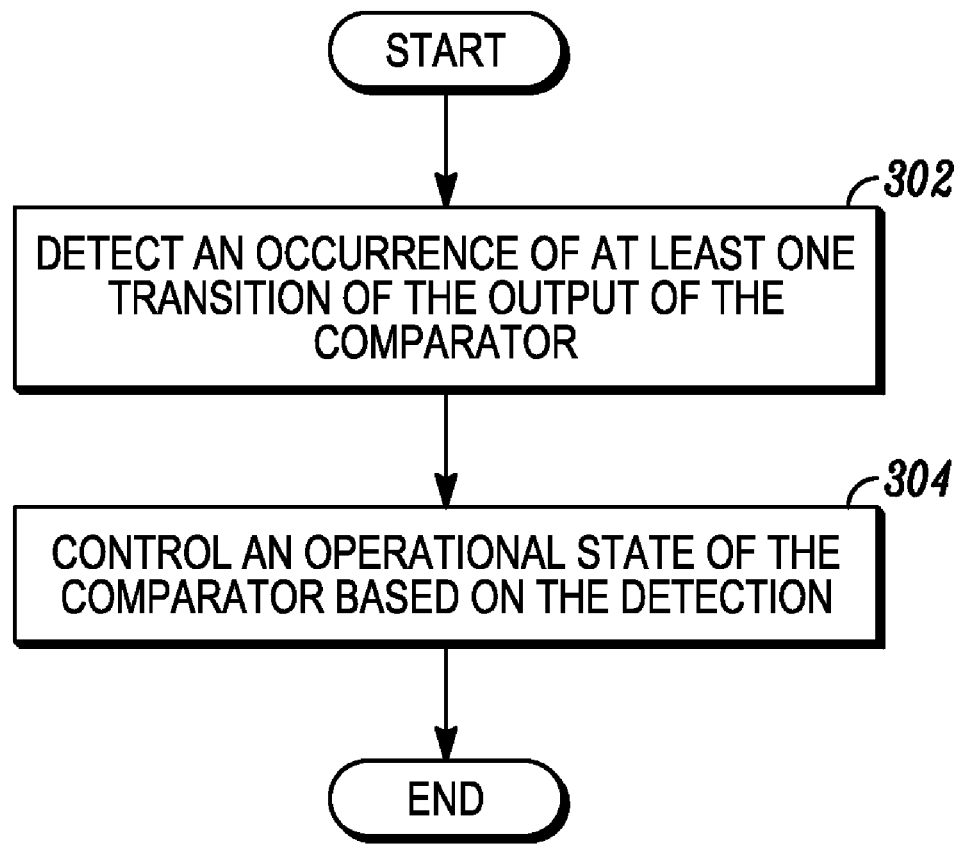
FIG. 3 is a flow diagram illustrating a method of operating a comparator, in accordance with another embodiment of the invention.

FIG. 3 is a flow diagram illustrating a method of operating the comparator, in accordance with another embodiment of the invention. At step 302, an occurrence of one or more transitions of the output of the comparator is detected. A transition of the output corresponds to a time instant when inputs to the comparator satisfy a condition which causes a transition of the output. A transition of the output may be a result of a change in a mathematical relationship between input signals of the comparator. For instance, in the comparator 110 of the PWM-ADC 100, before a time instant $t_c$, amplitude of the filtered signal 108 may be greater than amplitude of the reference triangular signal 112, and after the time instant $t_c$, amplitude of the filtered signal 108 may be less than amplitude of the reference triangular signal 112. Therefore, since a mathematical relationship between the filtered signal 108 and the reference triangular signal 112 changes at $t_c$, a transition of the output occurs at $t_c$.

A transition of the output of the comparator may generally correspond to a change between a plurality of output states of the comparator. Each of the plurality of output states may correspond to a mathematical relation between input signals of the comparator. The output state may be, but not limited to, one or more of a voltage level, a current level, and a frequency. More specifically, a transition of the output of the comparator may be a change from one predefined voltage level to another predefined voltage level. For example, a transition of the output of the comparator 110 corresponds to a change from +L Volts to −L Volts.

Thereafter, based on the detection of one or more transitions of the output of the comparator, the operational state of the comparator is controlled at step 304. The comparator is operated in one of the disabled state and the low power state based on the detection of one or more transitions. For example, in the PWM-ADC 100, subsequent to a detection of a transition of the output from +L volts to −L volts, the comparator 110 may be disabled by preventing the quantization clock 114 from triggering the comparator 110.

In an embodiment, the operational state of the comparator may be controlled based on an occurrence of a transition of a signal which is dependent on the output of the comparator. For example, in the PWM-ADC 100, output of the latch 118 is dependent on the output 116 of the comparator 110. Therefore, the operational state of the comparator 110 may be controlled based on a detection of a transition in output of the latch 118.

By operating the comparator in one of a disabled state and a low power state subsequent to the detection of one or more transitions of the output of the comparator, considerable amount of power may be saved. However, it is desirable to operate the comparator in an enabled state during a time interval when the input signals satisfy a condition which causes a transition of the output of the comparator. In other words, it is desirable to operate the comparator in an enabled state during a time interval when the output of the comparator is likely to undergo a transition.

Figure 4:
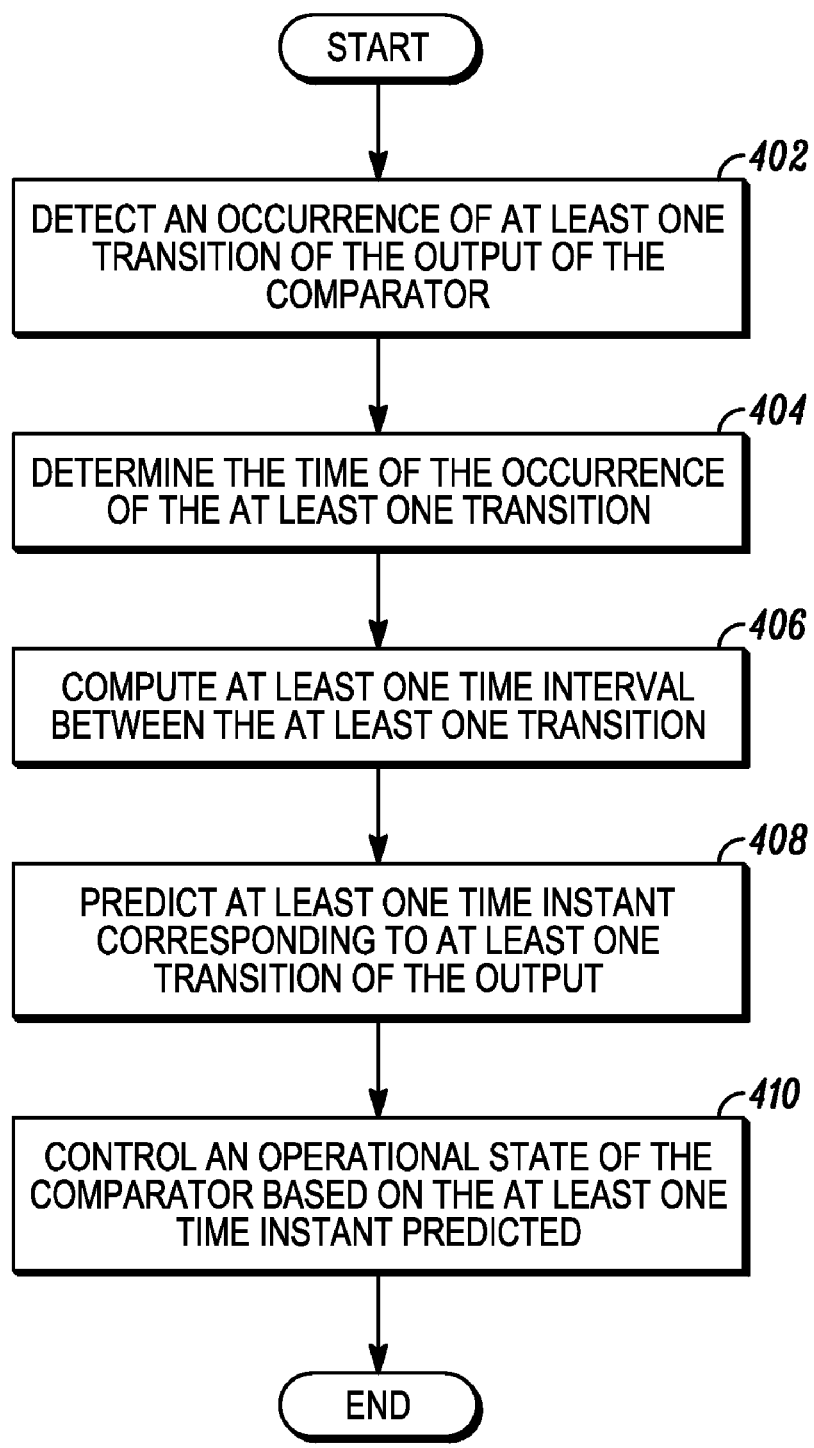
FIG. 4 is a flow diagram illustrating a method of operating a comparator, in accordance with another embodiment of the invention.

FIG. 4 is a flow diagram illustrating a method of operating a comparator, in accordance with another embodiment of the invention. At step 402, an occurrence of one or more transitions of the output of the comparator is detected. Thereafter, at step 404, the time of occurrence of one or more transitions is determined. For example, in the PWM-ADC 100, a consecutive sequence of transitions of the output of the comparator 110 may be detected, and time instants corresponding to the consecutive sequence of transitions may be determined.

Thereafter, at step 406, one or more time intervals between one or more transitions of the output are computed. A time interval between consecutive transitions may be computed from the time of occurrence of the consecutive transitions. For example, if a first transition of the output occurred at time T1 and a second transition of the output occurred at time T2, then the time interval between the first transition and the second transition may be computed by subtracting T1 from T2.

In an embodiment, a time interval between two transitions may be computed by counting a number of cycles of a periodic sampling wave during the time interval. The periodic sampling wave may be a quantization clock which triggers the comparator. It will be apparent to a person skilled in the art that the time interval between the two transitions may be computed by counting a number of cycles of any periodic wave.

Based on one or more time intervals, one or more time instants corresponding to one or more transitions of the output of the comparator are predicted at step 408. For example, based on the time intervals between consecutive sequence of transitions, a time instant corresponding to a transition may be predicted. In other words, based on time instants of past transitions of the output, a time instant corresponding to an occurrence of a future transition is predicted. In another embodiment, one or more time instants corresponding to one or more transitions of the output may be predicted based on the time of occurrence of one or more transitions. The time of occurrence of a transition may be relative to a reference periodic signal. For example, a time instant ($T_f$) corresponding to an occurrence of a transition from +L Volts to −L Volts may be determined relative to the reference triangular signal 112. Subsequently, a time of occurrence of a consecutive transition from +L Volts to −L volts may be predicted based on $T_f$.

Subsequently, at step 410, the operational state of the comparator is controlled based on one or more time instants predicted. Following the prediction of a time instant corresponding to the occurrence of a transition of the output, the comparator may operate in an enabled state at the time instant. Further, the comparator may operate in one of a disabled state and a low power state before the time instant. Referring to the example given above, a time of occurrence of a transition from +L Volts to −L volts may be predicted based on $T_f$. Following the prediction, the comparator may operate in an enabled state at Tf. Further, the comparator may operate in one of a disabled state and a low power state before Tf.

Figure 5:
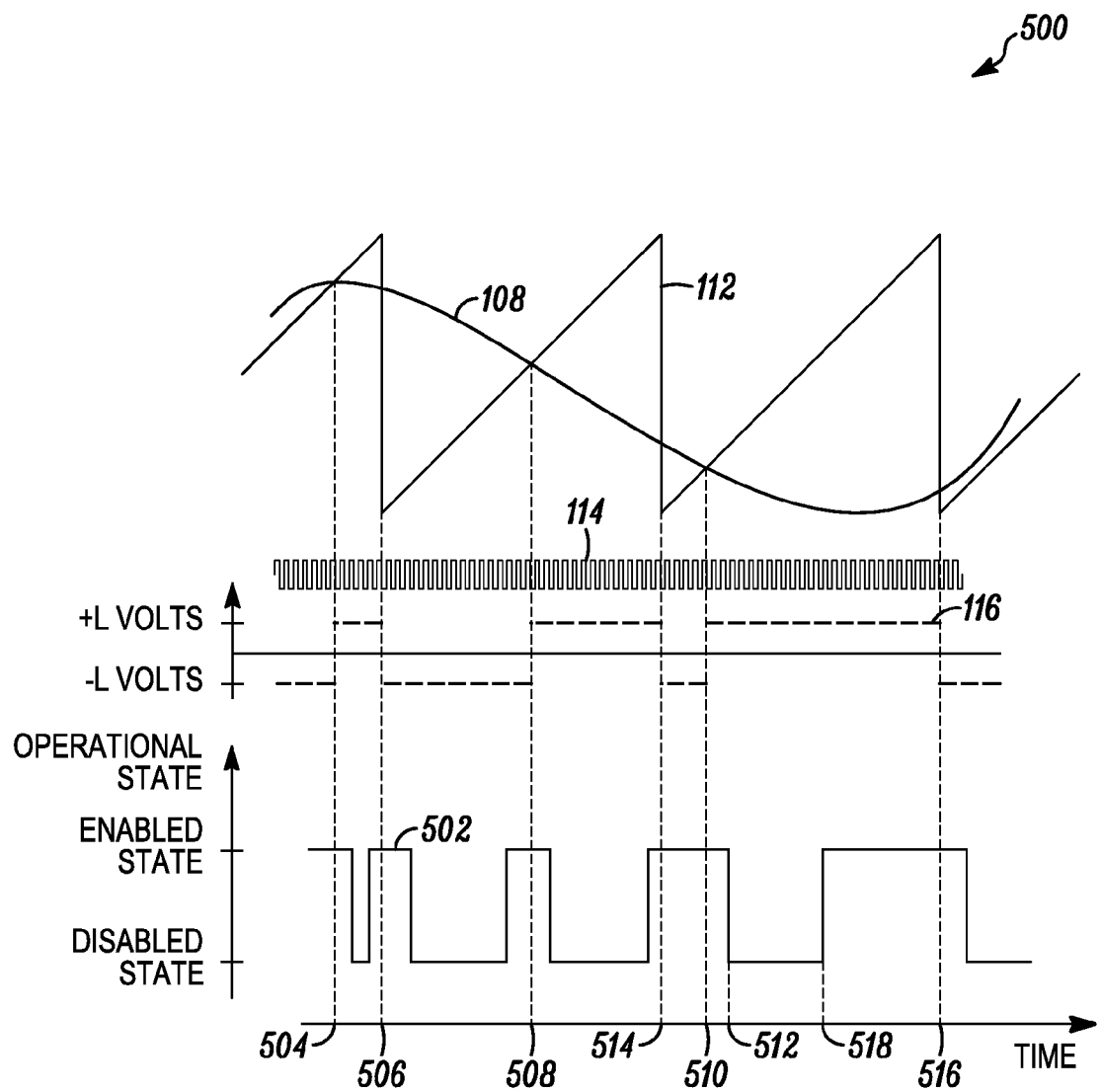
FIG. 5 is a graph illustrating the operation of a comparator in a PWM-ADC, in accordance with an exemplary embodiment of the invention.

FIG. 5 is a graph 500 illustrating the operation of the comparator 110 in the PWM-ADC 100, in accordance with an exemplary embodiment of the invention. The graph 500 shows the waveforms corresponding to the filtered signal 108, the reference triangular signal 112, the quantization clock 114, the output 116 of the comparator 110, and an operational state 502 of the comparator 110. In this exemplary embodiment the reference triangular signal 112 is a sawtooth wave. Alternatively, the reference triangular signal 112 may be a triangular wave.

The comparator 110 compares the filtered signal 108 and the reference triangular signal 112 at each time instant corresponding to a period of the quantization clock 114. Therefore, the output 116 includes a series of samples as shown in FIG. 5. The value of a sample at a time instant is based on a mathematical relationship between the filtered signal 108 and the reference triangular signal 112 at the time instant. For example, between a time instant 504 and a time instant 506, amplitude of the reference triangular signal 112 is greater than amplitude of the filtered signal 108. Accordingly, the value of samples of the output 116 of the comparator 110 between the time instant 504 and the time instant 506 is equal to +L volts. On the other hand, between the time instant 506 and a time instant 508, amplitude of the reference triangular signal 112 is lesser than amplitude of the filtered signal 108. Accordingly, the value of samples of the output 116 of the comparator 110 between the time instant 506 and the time instant 508 is equal to −L volts.

The output 116 of the comparator 110 is analyzed to detect an occurrence of a transition of the output 116, and based on the detection; the operational state 502 of the comparator 110 is controlled. For example, a transition is detected at a time instant 510. Subsequently, at the time instant 512, the operational state 502 is changed from the enabled state to the disabled state.

Further, time instants corresponding to one or more transitions of the output 116 are determined and a time interval between one or more transitions of the output 116 are computed. For example, a time interval between a transition occurring at a time instant 514 and a transition occurring at the time instant 510 is computed. The time interval may be computed by counting the number of cycles of the quantization clock 114 that occur during the time interval. Subsequently, based on the time interval, a time instant corresponding to a transition of the output 116 may be predicted. For example, based on time interval between the time instant 514 and the time instant 512, a time instant 518 may be predicted. Accordingly, the operational state 502 is changed from the disabled state to the enabled state at the time instant 518. However, actual transition of the output 116 occurs at a time instant 516. Therefore, in order to predict more accurately, more than one time intervals between transitions of the output 116 may be analyzed.

Alternatively, a time instant corresponding to a transition may be predicted based on a time of occurrence of one or more transitions of the output 116. For example, time instant 514 may be determined corresponding to the occurrence of a transition of the output 116 from +L Volts to −L volts in relation to reference triangular signal 112. Subsequently, time instant 516 may be predicted corresponding to a transition of the output 116 from +L Volts to −L Volts. Following the prediction, the comparator 110 may operate in the enabled state at time instant 516. Further, the comparator 110 may operate in one of the disabled state and the low power state before time instant 516.

Figure 6:
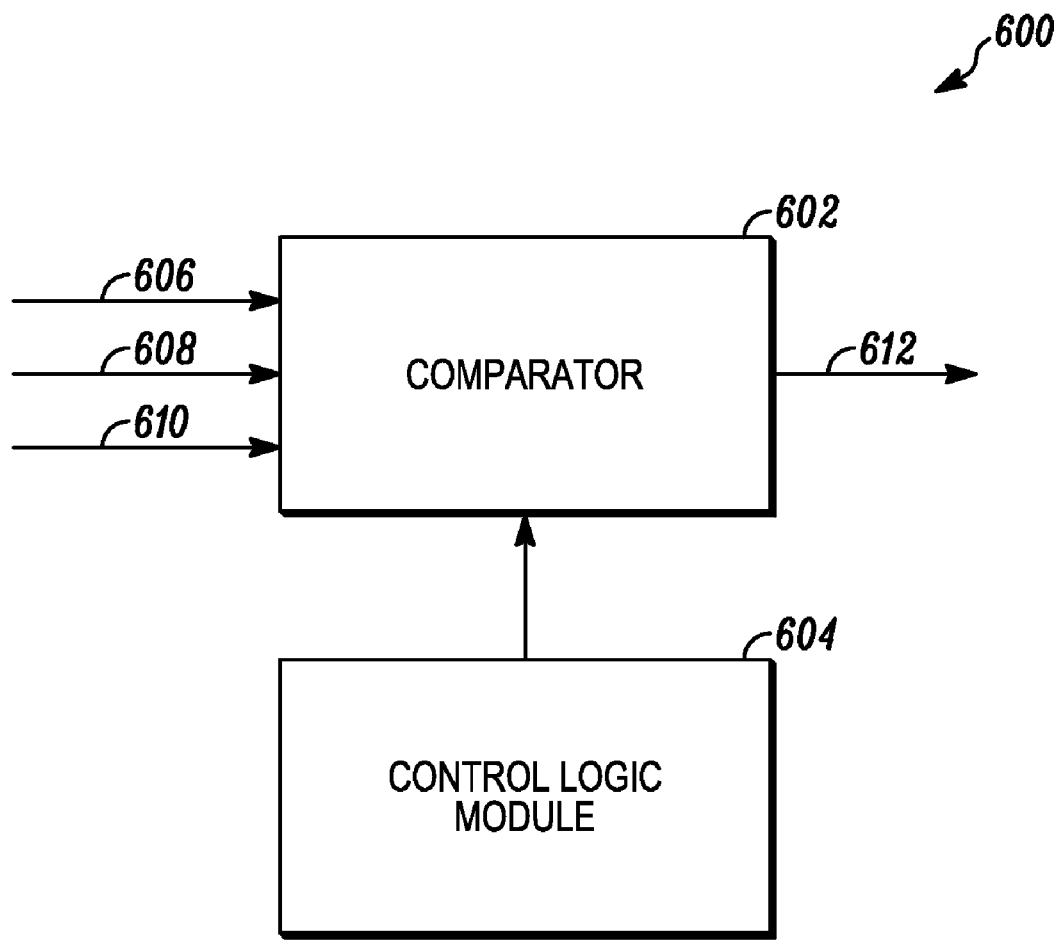
FIG. 6 is a block diagram illustrating a system for comparing a plurality of signals, in accordance with an embodiment of the invention.

FIG. 6 is a block diagram illustrating a system 600 for comparing a plurality of signals, in accordance with an embodiment of the invention. The system 600 may be a PWM-ADC. The system 600 includes a comparator 602 and a control logic module 604, which is operatively coupled to the comparator 602. The comparator 602 receives a plurality of input signals. For example, the comparator 602 receives an input analog signal 606 and a reference triangular signal 608. Further, the comparator 602 is enabled at one or more time instants by a periodic sampling wave 610. The periodic sampling wave 610 may be a quantization clock. The periodic sampling wave 610 triggers the comparator 602 at regular time instants. In other words, the periodic sampling wave 610 enables the comparator 602 at the regular time instants. As a result, an output 612 of the comparator 602 includes samples occurring at the regular time instants.

A frequency of the periodic sampling wave 610 may be several times higher than a frequency of the reference triangular signal 608. As a result, the output 612 includes an over-sampled PWM signal. In other words, the output 612 includes redundant samples. Therefore, a sequence of samples between two consecutive transitions of the output 612 has the same value. This redundancy may be used to control an operation state of the comparator 602. The operational state of the comparator 602 is one of an enabled state, a disabled state, and a low power state. This is further explained in conjunction with FIG. 7, described later.

The operational state of the comparator 602 is controlled by the control logic module 604 at one or more time instants. Controlling the operational state may involve changing the operational state. For example, the control logic module 604 may change the operational state of the comparator 602 from an enabled state to a disabled state at one or more time instants.

The control logic module 604 may operate the comparator 602 in one of a disabled state and a low power state at one or more time instants between the two consecutive transitions of the output 612. In an embodiment, the control logic module 604 may operate the comparator 602 in one of a disabled state and a low power state for a portion of a time period corresponding to each cycle of a predefined clock. A frequency of the predefined clock may be equal to the frequency of the reference triangular signal 608. In other words, the comparator 602 may operate in one of a disabled state and low power state for the time interval during each period of the reference triangular signal 608. Consequently, considerable amount of power is saved, which may otherwise have been dissipated in enabling the comparator 602 during the time interval.

Figure 7:
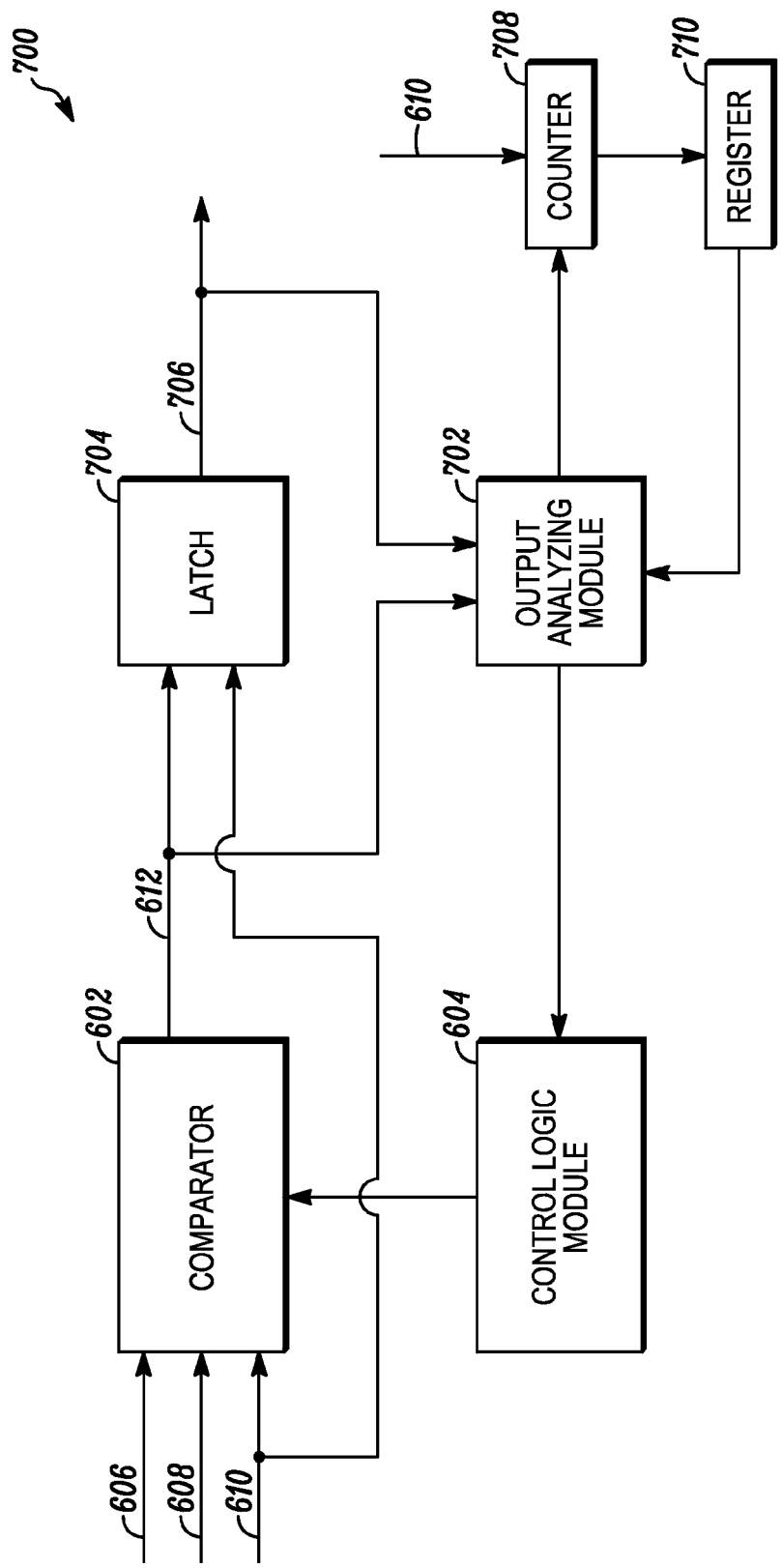
FIG. 7 is a block diagram illustrating a system for comparing a plurality of signals, in accordance with another embodiment of the invention.

FIG. 7 is a block diagram illustrating a system 700 for comparing a plurality of signals, in accordance with another embodiment of the invention. The system 700 includes the comparator 602, the control logic module 604, an output analyzing module 702, and a latch 704.

The output analyzing module 702 analyzes the output 612 of the comparator 602. Based on the analysis of the output 612, the control logic module 604 controls an operational state of the comparator 602. For example, the output analyzing module 702 may analyze the output 612 and detect a transition of the output 612. Subsequently, based on the detection, the control logic module 604 may operate the comparator 602 in one of a disabled state and low power state. By way of another example, the output analyzing module 702 may analyze one or more transitions of the output 612 and predict a time instant at which a transition of the output 612 may occur. Subsequently, based on the prediction, the control logic module 604 may operate the comparator 602 in an enabled state at the time instant predicted. This is explained further in conjunction with FIG. 8, described later.

Further, the output 612 of the comparator 602 is input to the latch 704 which is operatively coupled to one or more of the comparator 602 and the control logic module 604. The latch 704 holds a latest sample value of the output 612 of the comparator 602. The latch 704 generates a digital sample from the latest sample value of the output 612 as an output 706 of the latch 704. To enable the latch 704 to generate a digital sample corresponding to each sample value of the output 612, the periodic sampling wave 610 is applied to the latch 704, which synchronizes the latch 704 with the comparator 602. In an embodiment of the invention, the output analyzing module 702 analyzes the output 706 of the latch 704. Based on the analysis of the output 706, the control logic module 604 controls an operational state of the comparator 602. Further, the control logic module controls application of the periodic sampling wave 610 to the latch 704 based on the analysis of the output of the comparator 602.

After detecting occurrence of one or more transitions of the output 612, a counter 708 counts the number of cycles of the periodic sampling wave 610 between one or more transitions of the output 612. Thereafter, one or more results of the counter 708 corresponding to one or more transitions of the output 612 are stored in a register 710. For example, the register 710 may store a result of the counter 708 corresponding to two latest, consecutive transitions of the output 612. By way of another example, the register 710 may store a plurality of results of the counter 708 corresponding to a plurality of past transitions of the output 612. In another embodiment of the invention, the counter 708 may count the number of cycles of the periodic sampling wave 610 between one or more transitions of the output 706.

Based on one or more results of the counter 708 stored in the register 710, the output analyzing module 702 predicts a time instant at which a transition of the output 612 may occur. In another embodiment of the invention, the output analyzing module 702 may predict a time instant corresponding to a transition of the output 612 based on one or more time instants corresponding to transitions of the output 612. The one or more time instants may be absolute time instants. Alternatively, the one or more time instants may be determined relative to a reference periodic signal (e.g. the reference triangular signal 112). Subsequently, based on the time instant predicted by output the analyzing module 702, the control logic module 604 may operate the comparator 602 in one of a disabled state and low power state at one or more time instants before the time instant. Further, the control logic module 604 may operate the comparator 602 in the enabled state at the time instant. This is further explained in detail in conjunction with FIG. 8, described later.

Figure 8:
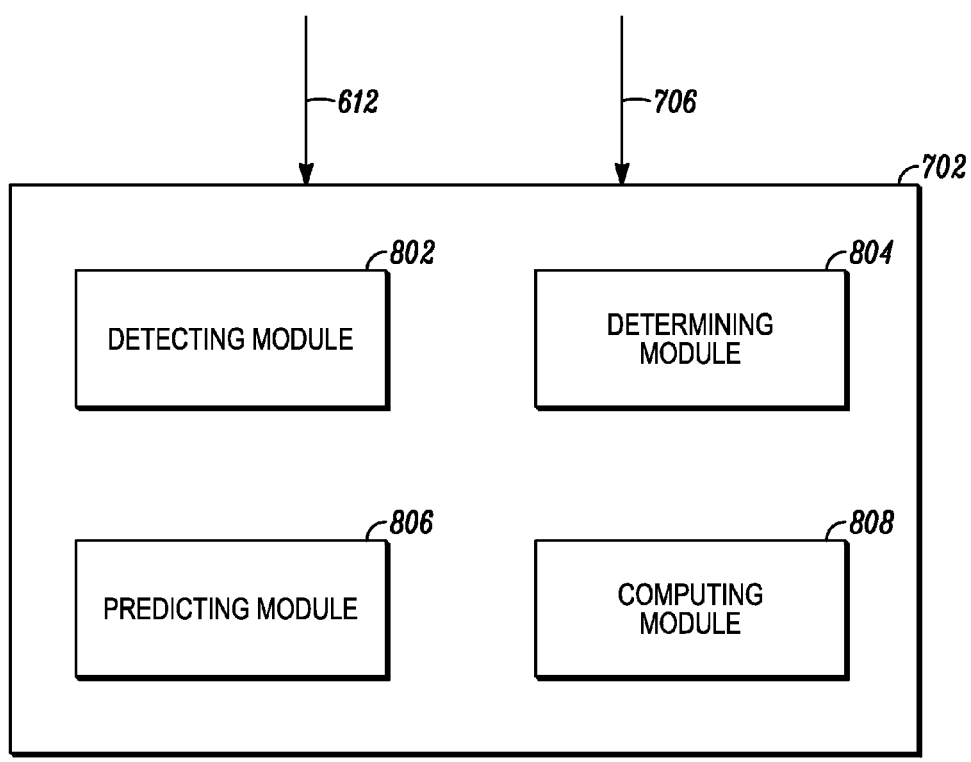
FIG. 8 is a block diagram illustrating the components of an output analyzing module, in accordance with an embodiment of the invention.

FIG. 8 is a block diagram illustrating the components of the output analyzing module 702, in accordance with an embodiment of the invention. The control logic module 604 controls the operational state of the comparator 602 based on detection of an occurrence of a transition of the output 612 of the comparator 602. For this, the output analyzing module 702 may include a detecting module 802 to detect occurrence of one or more transitions of the output 612. A transition of the output 612 corresponds to a time instant when inputs to the comparator 602 satisfy a condition which causes a transition of the output 612. In another embodiment, the detecting module 802 detects an occurrence of one or more transitions of the output 706 of the latch 704.

Further, a determining module 804 in the output analyzing module 702 determines the time of the occurrence of one or more transitions of the output 612. Alternatively, the determining module 804 may determine the occurrence of one or more transitions of the output 706 of the latch 704. Based on the time of the occurrence of one or more transitions of the output 612, a predicting module 806 predicts one or more time instants corresponding to one or more transitions of the output 612. Subsequently, based on one or more time instants predicted, the control logic module 604 controls the operational state of the comparator 602.

In another embodiment, the output analyzing module 702 includes a computing module 808. The computing module 808 computes one or more time intervals between one or more transitions of the output 612. Alternatively, the computing module 808 may compute one or more time intervals between one or more transitions of the output 706. For example, the computing module 808 may compute time intervals corresponding to a plurality of latest, consecutive transitions of the output of the comparator 602. Based on the time of the one or more time intervals, the predicting module 806 predicts one or more time instants corresponding to one or more transitions of the output 612. Subsequently, based on the one or more time instants predicted, the control logic module 604 controls the operational state of the comparator 602. This has been explained in conjunction with FIG. 3 and FIG. 4.

Figure 9:
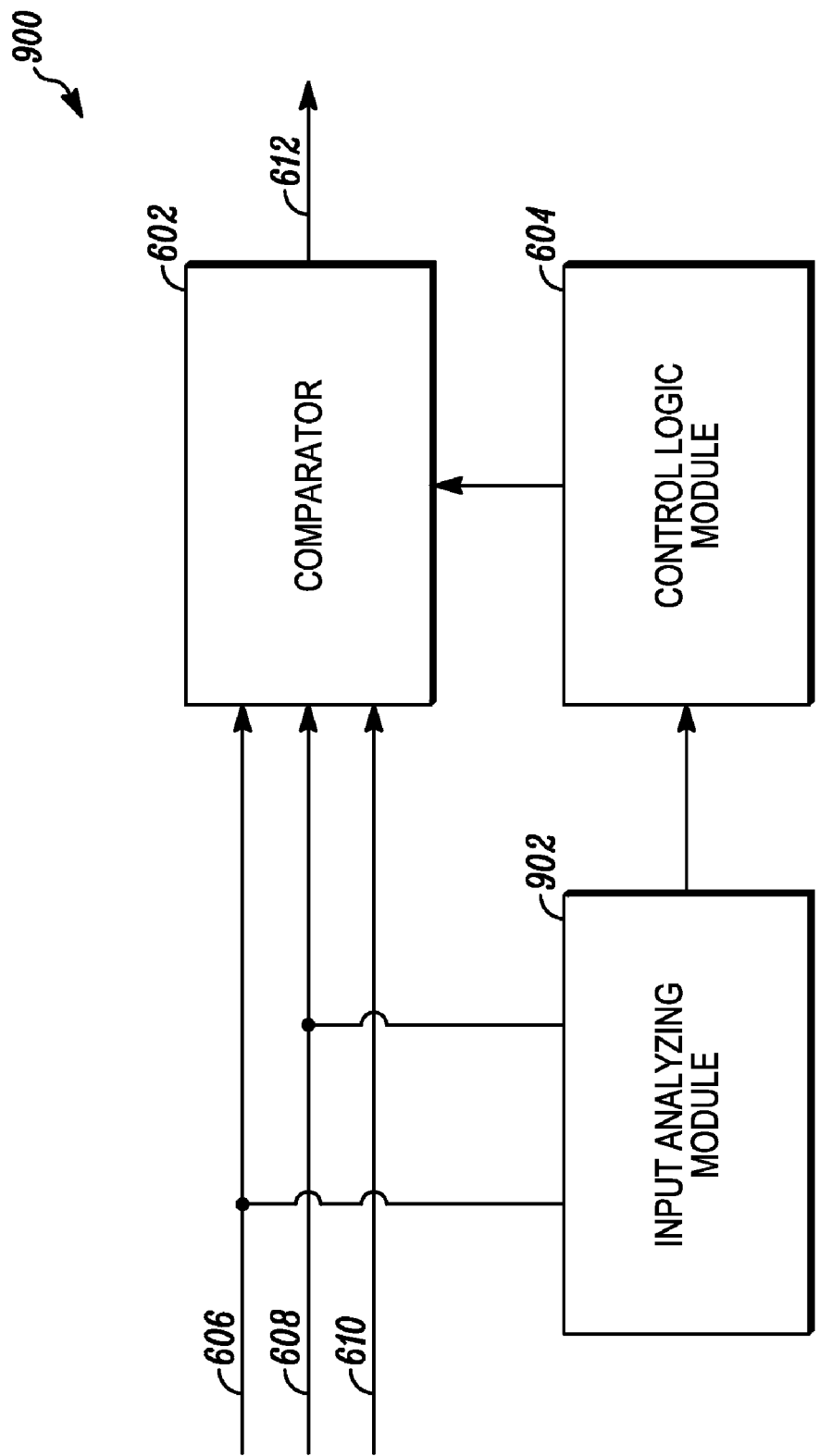
FIG. 9 is a block diagram illustrating a system for comparing a plurality of signals, in accordance with another embodiment of the invention.

FIG. 9 is a block diagram illustrating a system 900 for comparing a plurality of signals, in accordance with another embodiment of the invention. The system 900 includes the comparator 602, the control logic module 604, and an input analyzing module 902.

The input analyzing module 902 analyzes one or more signals received by the comparator 602. The input analyzing module 902 may detect an occurrence of a condition which may cause a transition of the output 612 of the comparator 602. This has been explained in conjunction with FIG. 3. The input analyzing module 902 may also determine one or more time instants corresponding to one or more occurrences of the condition. Thereafter, the input analyzing module 902 may compute one or more time intervals corresponding to one or more time instants. One or more time intervals may be used to predict one or more time instants corresponding to one or more transitions of the output 612.

Based on the analysis of one or more signals received by the comparator 602, the control logic module 604 controls the operational state of the comparator 602. For example, subsequent to detection of an occurrence of a condition which causes a transition of the output 612, the control logic module 604 may operate the comparator 602 in one of a disabled state and a low power state. By way of another example, based on a time instant predicted by the input analyzing module 902, the control logic module 604 may operate the comparator 602 in one of the disabled state and the low power state before the time instant. Additionally, the control logic module 604 may operate the comparator 602 in the enabled state at the time instant.

In an embodiment, the input analyzing module 902 detects strength of one or more signals received by the comparator 602. The strength of a signal refers to amplitude of the signal at one or more time instants. For example, the input analyzing module 902 may detect strength of the input analog signal 606. Thereafter, based on the strength of the input analog signal 606, the control logic module 604 may control the operational state of the comparator 602 at one or more time instants accordingly. For instance, the control logic module 604 may operate the comparator 602 in the disabled state for a time interval corresponding to each cycle of a predefined clock, wherein the time interval may be proportional to the strength of the input analog signal 606. As a result, considerable amount of power saving may be achieved.

Various embodiments of the invention provide methods and systems of operating a comparator. The comparator is selectively operated in an enabled, disabled state, and a low power state, based on the analysis of the output of the comparator. This selective operation of comparator helps in reducing the power consumed by the comparator. For example, in a PWM-ADC as much as 13% of the power consumed by the PWM-ADC is dissipated in a comparator. Therefore, selective operation of the comparator in the PWM-ADC reduces the percentage of power dissipated considerably.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method of operating a comparator, the method comprising:

analyzing an output of the comparator based on at least one of a transition of the output, present operational state of the comparator, and at least one time instant corresponding to the output wherein the analyzing comprises detecting an occurrence of at least one transition of the output of the comparator, further wherein the transition of the output corresponds to a time instant when inputs to the comparator satisfy a condition which causes the transition of the output of the comparator; and controlling an operational state of the comparator based on the analysis of the output.

2. The method of claim 1, wherein the operational state of the comparator is one of an enabled state, a disabled state, and a low power state.

3. The method of claim 1, wherein the comparator operates in one of a disabled state and a low power state based on the occurrence of the transition of the output.

4. The method of claim 1 further comprising determining the time of the occurrence of the at least one transition.

5. The method of claim 4 further comprising predicting at least one time instant corresponding to the at least one transition of the output of the comparator based on the time of occurrence of the at least one transition.

6. The method of claim 5 further comprising computing at least one time interval between the at least one transition of the output, the at least one time instant being predicted based on the at least one time interval.

7. The method of claim 6, wherein computing the at least one time interval comprises counting a number of cycles of a periodic sampling wave during the time interval.

8. The method of claim 7, wherein the periodic sampling wave is a quantization clock.

9. The method of claim 7, wherein the operational state of the comparator is controlled by gating the periodic sampling wave.

10. The method of claim 5, wherein the comparator operates in an enabled state at a time instant predicted corresponding to the transition of the output of the comparator.

11. The method of claim 5, wherein the comparator operates in one of a disabled state and a low power state before a time instant predicted corresponding to the transition of the output of the comparator.

12. The method of claim 2, wherein the comparator operates in at least one of the disabled state and the low power state when the output of the comparator is constant over a time interval.

13. The method of claim 1, wherein the comparator operates as a Pulse Width Modulated (PWM) Analog to Digital Converter (ADC).

14. A system for comparing a plurality of signals, the system comprising:
a comparator for receiving the plurality of signals, wherein the comparator is enabled at one or more time instants by a periodic sampling wave;
an output analyzing module configured to analyze an output of the comparator wherein the output analyzing module comprises a detecting module configured to detect an occurrence of at least one transition of the output of the comparator, further wherein the transition of the output corresponds to a time instant when inputs to the comparator satisfy a condition which causes the transition of the output of the comparator; and
a control logic module operatively coupled to the comparator, wherein the control logic module controls an operational state of the comparator on at least one time instant based on the analysis of the output of the comparator.

15. The system of claim 14, wherein the output of the comparator is stored in a latch.

16. The system of claim 15, wherein the control logic module controls application of the periodic sampling wave to the latch based on the analysis of the output of the comparator.

17. The system of claim 14 further comprising a determining module configured to determine the time of the occurrence of the at least one transition.

18. The system of claim 14, wherein the output analyzing module further comprises a predicting module to predict at least one time instant corresponding to the time of the occurrence of the at least one transition.

19. The system of claim 18 further comprising a computing module configured to compute at least one time interval between the at least one transition of the output.

20. The system of claim 14 further comprising at least one of:
a counter, wherein the counter is configured to count the number of cycles of a periodic sampling wave between at least one transition of the output of the comparator; and
a register, wherein the register stores at least one result of the counter corresponding to the at least one transition.

21. The system of claim 14, wherein the system is a Pulse Width Modulated (PWM) Analog to Digital Converter (ADC).

22. The system of claim 14, wherein the operational state of the comparator is one of an enabled state, a disabled state, and a low power state.

23. The system of claim 21, wherein the control logic module operates the comparator in one of a disabled state and a low power state on at least one time instant corresponding to each cycle of a predefined clock.

24. The system of claim 14 further comprising an input analyzing module configured to analyze the at least one signal received by the comparator.

25. The system of claim 24, wherein the input analyzing module is further configured to detect strength of the at least one signal based on the analysis of the at least one signal received by the comparator.

26. The system of claim 23, wherein the control logic module controls the operational state of the comparator based on the analysis of the at least one signal received by the comparator.

27. The system of claim 24, wherein the input analyzing module is further configured to detect an occurrence of a condition which causes the transition of the output of the comparator.

* * * * *

UNITED STATES PATENT AND TRADEMARK OFFICE
CERTIFICATE OF CORRECTION

| | | |
|---|---|---|
| PATENT NO. | : 7,570,190 B1 | Page 1 of 1 |
| APPLICATION NO. | : 12/057696 | |
| DATED | : August 4, 2009 | |
| INVENTOR(S) | : Pagones et al. | |

It is certified that error appears in the above-identified patent and that said Letters Patent is hereby corrected as shown below:

ON THE TITLE PAGE

1. On the Face Page, in Field (56), under "OTHER PUBLICATIONS", in Column 2, Line 1, delete "$\Delta E$" and insert -- $\Delta \Sigma$ --, therefor.

2. On the Face Page, in Field (56), under "OTHER PUBLICATIONS", in Column 2, Line 4, delete "$\Delta E$" and insert -- $\Delta \Sigma$ --, therefor.

Signed and Sealed this

Twenty-fourth Day of August, 2010

David J. Kappos
*Director of the United States Patent and Trademark Office*